(12) United States Patent
Iljima et al.

(10) Patent No.: US 6,884,655 B2
(45) Date of Patent: Apr. 26, 2005

(54) SEMICONDUCTOR PACKAGE, METHOD OF MANUFACTURING THE SAME, AND SEMICONDUCTOR DEVICE

(75) Inventors: Takahiro Iljima, Nagano (JP); Akio Rokugawa, Nagano (JP); Noriyoshi Shimizu, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/709,912

(22) Filed: Jun. 4, 2004

(65) Prior Publication Data

US 2004/0209398 A1 Oct. 21, 2004

Related U.S. Application Data

(62) Division of application No. 10/225,305, filed on Aug. 22, 2002, now Pat. No. 6,764,931.

(30) Foreign Application Priority Data

Aug. 24, 2001 (JP) .................................. 2001-254760

(51) Int. Cl.[7] .......................... H01L 21/44; H01L 21/48; H01L 21/50
(52) U.S. Cl. ...................... 438/107; 438/106; 438/125; 174/250; 174/256; 174/260; 428/901
(58) Field of Search ................................ 438/106, 107, 438/125; 174/250, 256; 428/901

(56) References Cited

U.S. PATENT DOCUMENTS

| | | | | |
|---|---|---|---|---|
| 4,526,835 A | * | 7/1985 | Takahashi et al. | 428/413 |
| 4,668,332 A | * | 5/1987 | Ohnuki et al. | 216/19 |
| 4,830,704 A | * | 5/1989 | Voss et al. | 216/18 |
| 4,864,722 A | * | 9/1989 | Lazzarini et al. | 29/830 |
| 5,010,641 A | * | 4/1991 | Sisler | 29/830 |
| 5,796,587 A | | 8/1998 | Lauffer et al. | 361/763 |
| 6,072,690 A | * | 6/2000 | Farooq et al. | 361/321.2 |
| 6,074,567 A | * | 6/2000 | Kuraishi et al. | 216/18 |
| 6,214,445 B1 | * | 4/2001 | Kanbe et al. | 428/209 |
| 6,343,001 B1 | * | 1/2002 | Japp et al. | 361/306.3 |
| 6,580,036 B1 | * | 6/2003 | Kim et al. | 174/261 |
| 6,815,085 B1 | * | 11/2004 | Appelt et al. | 428/626 |
| 2004/0150114 A1 | * | 8/2004 | Fraley et al. | 257/777 |
| 2004/0160751 A1 | * | 8/2004 | Inagaki et al. | 361/763 |

OTHER PUBLICATIONS

Nakamura et al.; "Polyimide Films Prepared by Electrophoretic Deposition and Their Dielectric Breakdown", SPIE, vol. 2780, pp. 71–75, Sep. 11–14, 1995.

* cited by examiner

*Primary Examiner*—John F. Niebling
*Assistant Examiner*—Angel Roman
(74) *Attorney, Agent, or Firm*—Armstrong, Kratz, Quintos, Hanson & Brooks, LLP

(57) ABSTRACT

A wiring layer for serving as a first electrode layer of a capacitor portion patterned in a predetermined shape on an insulative base member is formed. A resin layer for serving as a dielectric layer of the capacitor portion is formed on a surface of the wiring layer using an electrophoretic process. Another wiring layer for serving as a second electrode layer of the capacitor portion patterned in a predetermined shape by patterning on the insulative base member inclusive of the resin layer is formed.

4 Claims, 9 Drawing Sheets

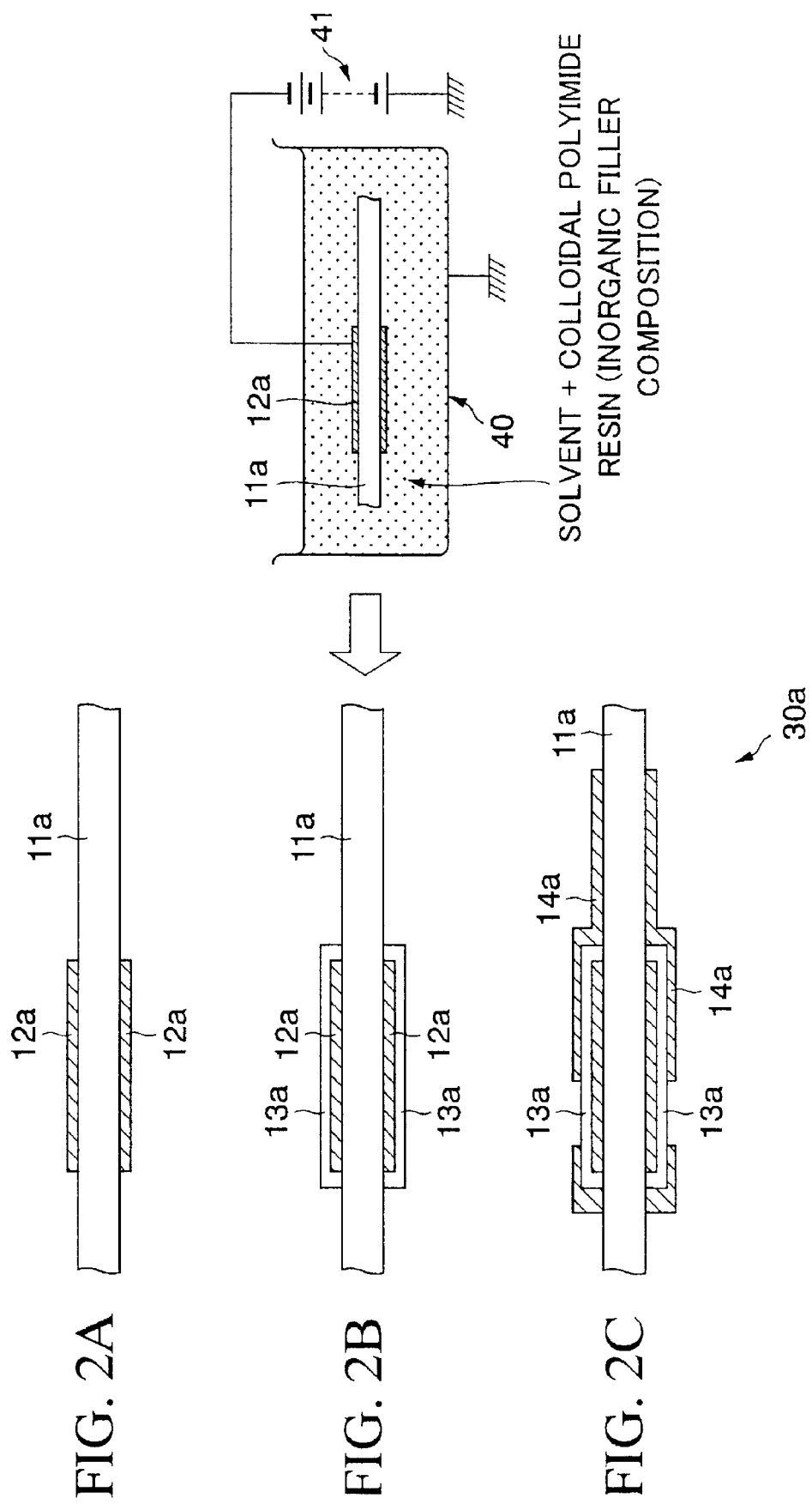

US 6,884,655 B2

SEMICONDUCTOR PACKAGE, METHOD OF MANUFACTURING THE SAME, AND SEMICONDUCTOR DEVICE

CROSS REFERENCE TO RELATED APPLICATIONS

This application is a divisional application of U.S. patent application Ser. No. 10/225,305 filed Aug. 22, 2002 now U.S. Pat. No. 6,764,931.

BACKGROUND OF THE INVENTION

(A) Field of the Invention

The present invention relates to technologies for manufacturing multilayer wiring boards used as packages for mounting semiconductor elements (hereinafter referred to as "semiconductor packages"). More specifically, the present invention relates to a semiconductor package containing a capacitor portion using a conductive resin layer formed on a wiring layer, a method of manufacturing the same and a semiconductor device.

(B) Description of the Related Art

In order to meet demands for higher density, semiconductor packages in recent years include wiring patterns which are disposed close to one another. Accordingly, such semiconductor packages would incur problems such as an occurrence of crosstalk noises between a plurality of wiring, or fluctuation of electric potential of power source line and the like. In particular, a package for mounting a semiconductor element for high-frequency use, in which high-speed switching operations are required, tends to incur crosstalk noises along with an increase in frequency or incur switching noises because a switching element therein is turned on and off in a high speed. As a result, electric potential of a power source line and the like tends to vary easily.

Therefore, as a remedy for the foregoing problems, "decoupling" of a signal line or a power source line has been heretofore put into practice. Such decoupling is carried out by adding capacitor elements such as chip capacitors to a package mounting a semiconductor element thereon.

However, in this case, design freedom of wiring patterns may be restricted by provision of the chip capacitors, or an increase in inductance may be incurred due to elongated wiring patterns for connecting the chip capacitors and power/ground terminals of the semiconductor element. As the decoupling effect of the chip capacitor is impaired where the inductance is large, it is preferred to set the inductance as small as possible. In other words, it is desirable to dispose the capacitor elements such as chip capacitors as close to the semiconductor element as possible.

There is also a risk that the package becomes larger and heavier as a whole because the capacitor elements such as chip capacitors are added to the package, which goes against the tide of downsizing and weight saving of semiconductor packages in recent years.

Therefore, instead of adding the capacitor elements such as chip capacitors to the package, it is conceivable to allow the package to contain equivalent capacitor elements (capacitor portions) in order to deal with the above-mentioned inconveniences.

Conventionally, technologies for building the capacitor portion into the package have been limited to a few methods, such as a method of laminating a sheet member containing inorganic filler for improving dielectric constant between wiring layers, as a dielectric layer of the capacitor portion.

As described above, in the conventional semiconductor package, the sheet member made of a high-dielectric material is laminated between the wiring layers as the dielectric layer of the capacitor portions in the case of allowing the package to contain the capacitor elements (the capacitor portions) for exerting the decoupling effect. In this context, it is necessary to form an insulating layer between the wiring layers thicker than the dielectric layer concerned. Accordingly, there arises an inconvenience in that the thickness of the interlayer insulating film cannot be sufficiently made thin.

Such an inconvenience inhibits formation of a low-profile semiconductor package and resultantly goes against the tide of recent demands for providing a high-density equipped semiconductor device while reducing an entire thickness of the package. In addition, costs for an interlayer insulating film rise as a film thickness thereof increases. As a result, there is also a problem of an increase in manufacturing costs of the package.

SUMMARY OF THE INVENTION

An object of the present invention is to provide a semiconductor package capable of containing a capacitor portion for exerting a decoupling effect without inhibiting formation of a low-profile package or increasing manufacturing cost, and also to provide a manufacturing method thereof and a semiconductor device.

To attain the above object, according to one aspect of the present invention, there is provided a method of manufacturing a semiconductor package containing a capacitor portion. Here, the method includes the steps of forming a first wiring layer on an insulative base member, the first wiring layer being patterned in a predetermined shape for serving as a first electrode layer of the capacitor portion, forming a resin layer on a surface of the first wiring layer for serving as a dielectric layer of the capacitor layer by an electrophoretic deposition process, and forming a second wiring layer on the insulative base member inclusive of the resin layer, the second wiring layer being patterned in a predetermined shape for serving as a second electrode layer of the capacitor portion.

According to the method of manufacturing a semiconductor package of the present invention, it is possible to constitute the capacitor portion by using the resin layer formed on the first wiring layer on the insulative base member by the electrophoretic deposition process as the dielectric layer and by using the first wiring layer and the second wiring layer formed on the insulative base member inclusive of the resin layer severally as electrode layers.

In this way, a desired decoupling effect (suppression of occurrence of crosstalk noises between a plurality of wiring, suppression of variation in electric potential of a power source line, and the like) can be realized. Moreover, some of the members constituting the package (namely, the first and the second wiring layers and the resin layer) are also used as the respective electrode layers and as the dielectric layer of the capacitor portion. Accordingly, it is unnecessary to build a sheet member into the package for capacitor elements as encountered in the prior art. Such an advantage contributes to a formation of a low-profile semiconductor package as well as to a reduction in manufacturing costs.

Moreover, according to another aspect of the present invention, there is provided a semiconductor package manufactured in accordance with the above-described method of manufacturing a semiconductor package.

Furthermore, according to still another aspect of the present invention, there is provided a semiconductor device comprising the above-mentioned semiconductor package and a semiconductor element mounted on an opposite side of the semiconductor package to the side where the external connection terminals are bonded, electrode terminals of the semiconductor element being electrically connected to the conductors exposed from the openings formed in the protective film.

DETAILED DESCRIPTION OF THE PREFERRED EMBODIMENTS

Figure 1:
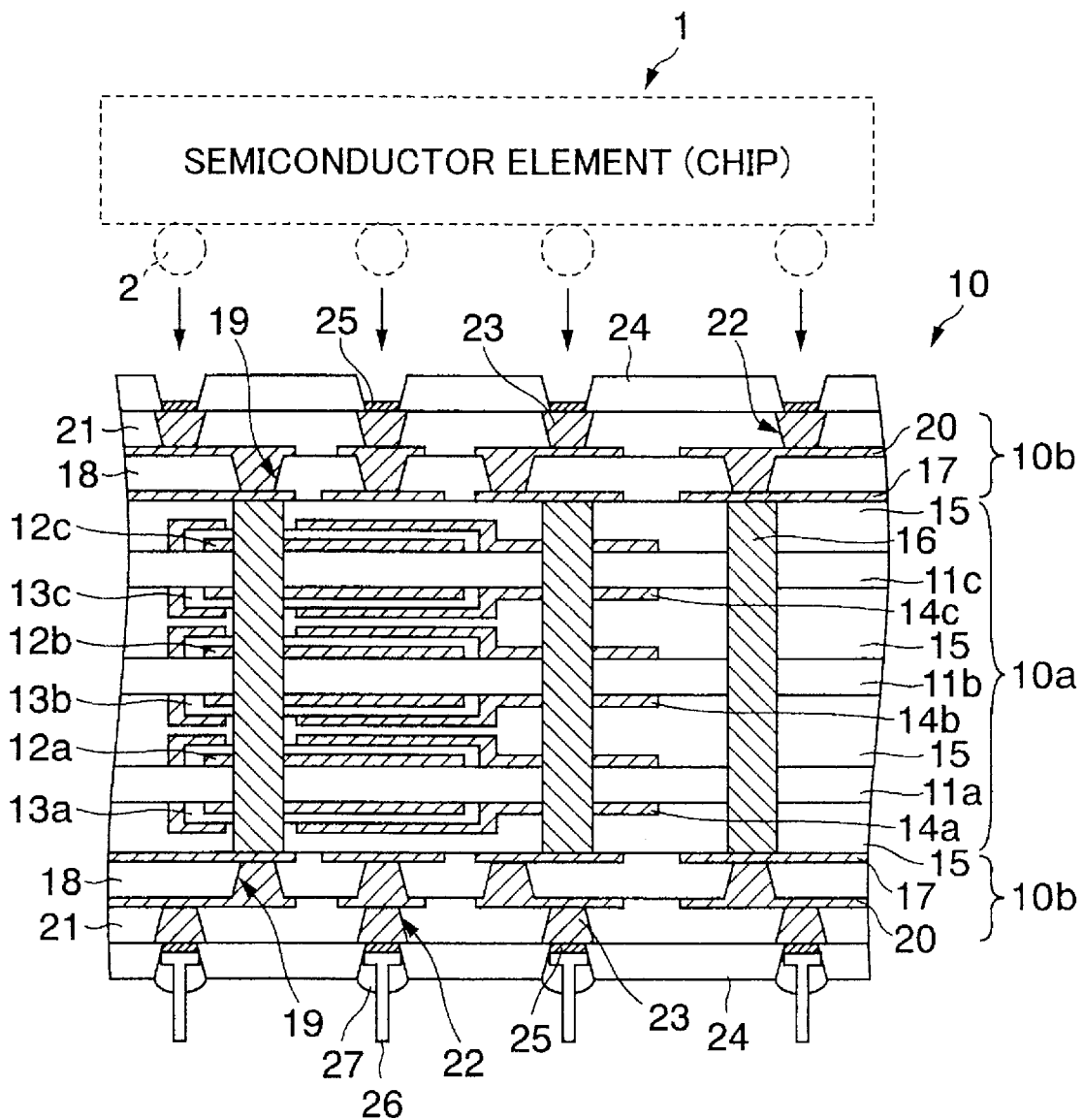
FIG. 1 is a cross-sectional view showing a constitution of a semiconductor package according to one embodiment of the present invention.

FIG. 1 is a cross-sectional view schematically showing a constitution of a semiconductor package according to one embodiment of the present invention.

In the drawing, reference numeral 10 denotes a semiconductor package of this embodiment, which includes a laminated core portion 10a formed by laminating a predetermined number of print wiring boards as described layer, and build-up wiring portions 10b formed on both surfaces of the laminated core portion 10a by laminating a predetermined number of layers in accordance with a build-up method. A semiconductor element (chip) 1 is mounted on this semiconductor package 10 as illustrated with broken lines via electrode terminals 2 (such as solder bumps or gold (Au) bumps) thereof.

In the semiconductor package 10, reference numerals 11a, 11b and 11c denote insulative base members as core members of respective print wiring boards to be described later. Reference numerals 12a, 12b and 12c denote wiring layers severally formed on both surfaces of the insulative base members 11a, 11b and 11c by patterning. Reference numerals 13a, 13b and 13c denote resin layers severally formed by an electrophoretic deposition process (to be described later) on surfaces of the wiring layers 12a, 12b and 12c. Reference numerals 14a, 14b and 14c denote wiring layers severally formed on the both surfaces of the insulative base members 11a, 11b and 11c inclusive of the resin layers 13a, 13b and 13c by patterning. Reference numeral 15 denotes prepreg layers (insulating layers) functioning as adhesive layers upon lamination of the respective print wiring boards. Reference numeral 16 denotes conductors filled in through holes formed in predetermined positions of the laminated core portion 10a. Reference numeral 17 denotes wiring layers (inclusive of pads) formed on the insulating layers 15 by patterning so as to be electrically connected to the conductors 16. Reference numeral 18 denotes resin layers (insulating layers) formed on the wiring layers 17 and on the insulating layers 15. Reference numeral 19 denotes via holes formed on the resin layers 18 so as to reach the pads of the wiring layers 17. Reference numeral 20 denotes wiring layers (inclusive of pads) formed on the resin layers 18 by patterning so as to be filled inside the via holes 19. Reference numeral 21 denotes resin layers (insulating layers) formed on the wiring layers 20 and on the resin layers 18. Reference numeral 22 denotes via holes formed on the resin layers 18 so as to reach the pads of the wiring layers 20. Reference numeral 23 denotes conductors filled in the via holes 22.

Reference numeral 24 denotes solder resist layers as protective layers (insulating layers) formed so as to cover both surfaces of a multilayer wiring board other than portions on the conductors 23. Reference numeral 25 denotes nickel (Ni)/gold (Au) plated films formed on the conductors 23 exposed from openings of the solder resist layers 24. Reference numeral 26 denotes pins serving as external connection terminals upon mounting the package 10 onto a mother board or the like. Moreover, reference numeral 27 denotes solder for bonding the pins 26 to the plated films 25 on the conductors 23 exposed from the openings of the solder resist layer 24 on a lower side.

Meanwhile, upon mounting the semiconductor chip 1 on the package 10, the electrode terminals 2 thereof (such as the solder bumps) are bonded to the plated films 25 on the conductors 23 exposed from the openings of the solder resist layer 24 on an upper side.

The semiconductor package 10 of this embodiment is basically characterized by the built-in capacitor portions, more specifically, by formation of the resin layers 13a, 13b and 13c by the electrophoretic deposition process (to be described later) on the wiring layers 12a, 12b and 12 formed on both surfaces of the insulative base members 11a, 11b and 11c used as the core members of the printed wiring boards, and further by use of the respective resin layers as dielectric layers of the capacitor portions.

The semiconductor package 10 of this embodiment is also characterized by the multilayer wiring structure thereof, which is formed by laminating that the predetermined number of the printed wiring boards provided with the capacitor portions to form the laminated core portion 10a, and by laminating the predetermined number of the layers (which are two layers in the illustrated example) on the both surfaces of the laminated core portion 10a in accordance with the build-up method to form the build-up wiring portions 10b.

The respective resin layers 13a, 13b and 13c constitute the dielectric layers of the respective capacitor portions. Accordingly, in terms of characteristics of the capacitors, it is preferable that the respective resin layers 13a, 13b and 13c are made of materials having a high dielectric constant. In this embodiment, the resin layers 13a, 13b and 13c are made of polyimide resin blended with inorganic filler having high dielectric constant (wherein the dielectric constant thereof is 20 or higher, for example). Moreover, each of the pins 26 electrically connected to the respective wiring layers 12a, 12b and 12c through the conductors 16, the respective wiring layers 17 and 20, the conductors 23 and the plated films 25, constitutes a first electrode of each of the capacitor portions. Meanwhile, each of the pins 26 electrically connected to the respective wiring layers 14a, 14b and 14c formed on the respective resin layers 13a, 13b and 13c through the conductor 16, the respective wiring layers 17 and 20, the conductors 23 and the plated films 25, constitutes a second electrode of each of the capacitor portions.

Ceramic powder with grain sizes within 5 $\mu$m, for example, is used as the organic filler (dielectric material) having the dielectric constant of 20 or higher. Preferably, ceramic powder having a perovskite structure (such as $BaTiO_3$, PZT, or $SrTiO_3$) is used therefor. Although a commercially available product can be used as the dielectric powder of the above-mentioned types, it is desirable that the powder is used after provided with a thermal process. For example, if $SrTiO_3$ is used as the dielectric powder, it is desirable that $SrTiO_3$ is subjected to a process for one hour or longer at a heating temperature no less than 600° C. in the atmosphere.

Meanwhile, materials to be used for the insulative base members 11a, 11b and 11c include, for example, glass fabric impregnated with insulative resin (such as epoxy resin, polyimide resin, BT resin or PPE resin), polyimide films coated with a polyimide-type thermoplastic adhesive on both surfaces thereof, or the like. Moreover, a material made of glass fabric impregnated with thermosetting epoxy resin or the like and processed into a sheet at a semi-hardened B stage is used as the prepreg layer 15. Moreover, copper (Cu) is used as the material for the wiring layers 12a, 12b, 12c, 14a, 14b, 14c, 17 and 20 as well as for the conductors 16 and 23. Furthermore, koval plated with Ni/Au, for example, is used as the material for the pins 26.

Now, description will be made regarding a method of manufacturing the semiconductor package 10 of this embodiment with reference to FIG. 2A to FIG. 2P, which sequentially illustrate the manufacturing steps thereof.

In the first step (FIG. 2A), the insulative base member 11a serving as the core member of the printed wiring board is prepared, and then wiring patterns (the wiring layers 12a) of predetermined shapes are formed on both surfaces thereof severally by photolithography.

To be more precise, a sheet member made of glass fabric impregnated with insulative resin (such as epoxy resin, polyimide resin or BT resin) is used for example, and copper foils are adhered to both surfaces of this sheet member by thermal press (which is so-called a "copper-clad laminate") upon preparation of the insulative base member 11a. Thereafter, dry films, for example, are attached to both surfaces of the copper-clad laminate as photosensitive resists by thermocompression bonding. Then, the dry films are subjected to exposure and development in accordance with predetermined shapes using masks (patterning the dry films), whereby openings are formed on the dry films at the portions other than the portions corresponding to the predetermined shapes. Thereafter, the copper foils at the portions corresponding to regions of the openings are removed by wet etching using an acidic solution, for example. Finally, the dry films are peeled off. In this way, it is possible to form the wiring patterns (the wiring layers 12a) of the predetermined shapes. Each of the wiring layers 12a thus formed constitutes a first electrode layer of each of the capacitor portions.

In the next step (FIG. 2B), surfaces of the wiring layers 12a are covered with polyimide resin using the electrophoretic deposition process, whereby the resin layers 13a are formed thereon.

Specifically, as exemplified on the right side of the drawing, a solvent (such as ethanol) containing colloidal dispersion of polyimide resin (an inorganic filler composition) is prepared in an electrolytic cell 40. Then the structure fabricated in the precedent step (the insulative base member 11a provided on the both surfaces with the wiring layers 12a) is soaked in the electrolytic cell 40, and electric field (a power source 41) of a given magnitude is applied between the electrolytic bath 40 and the wiring layers 12a severally serving as electrodes. Accordingly, the colloid is electrophoresed by this electric field, whereby the polyimide resin covers the surfaces of the wiring layers 12a (formation of the resin layers 13a). The resin layers 13a thus formed constitute the dielectric layers of the capacitor portions.

In the next step (FIG. 2C), wiring patterns (the wiring layers 14a) of predetermined shapes are formed on both surfaces of the insulative base member 11a inclusive of the resin layers 13a severally by photolithography.

To be more precise, thin-film Cu layers are firstly formed on the entire surfaces of the insulative base member 11a and the resin layers 13a by sputtering or electroless plating of Cu. Then, conductive layers are formed on the thin-film Cu layers by electrolytic plating of Cu using the thin-film Cu layers as feed layers. Thereafter, the wiring layers 14a are formed by patterning the conductive layers into predetermined shapes.

The wiring layers 14a can be formed by a process similar to the process performed in the step of FIG. 2A. Specifically, photosensitive dry films are attached to surfaces of the conductive layers (the Cu layers) formed on the base member 11a and the resin layers 13a. Then, the dry films are subjected to exposure and development in accordance with predetermined shapes using masks (patterning the dry films), whereby openings are formed on the dry films at the portions other than the portions corresponding to the predetermined shapes. Thereafter, the copper layers at the portions corresponding to regions of the openings are removed by wet etching, for example. Finally, the dry films are peeled off. In this way, it is possible to form the wiring patterns (the wiring layers 14a) of the predetermined shapes. Each of the wiring layers 14a thus formed constitutes a second electrode layer of each of the capacitor portions.

According to the foregoing steps, a printed wiring board 30a including the capacitor portions (the wiring layers 12a and 14a, and the resin layers 13a) is fabricated.

Figure 2D:
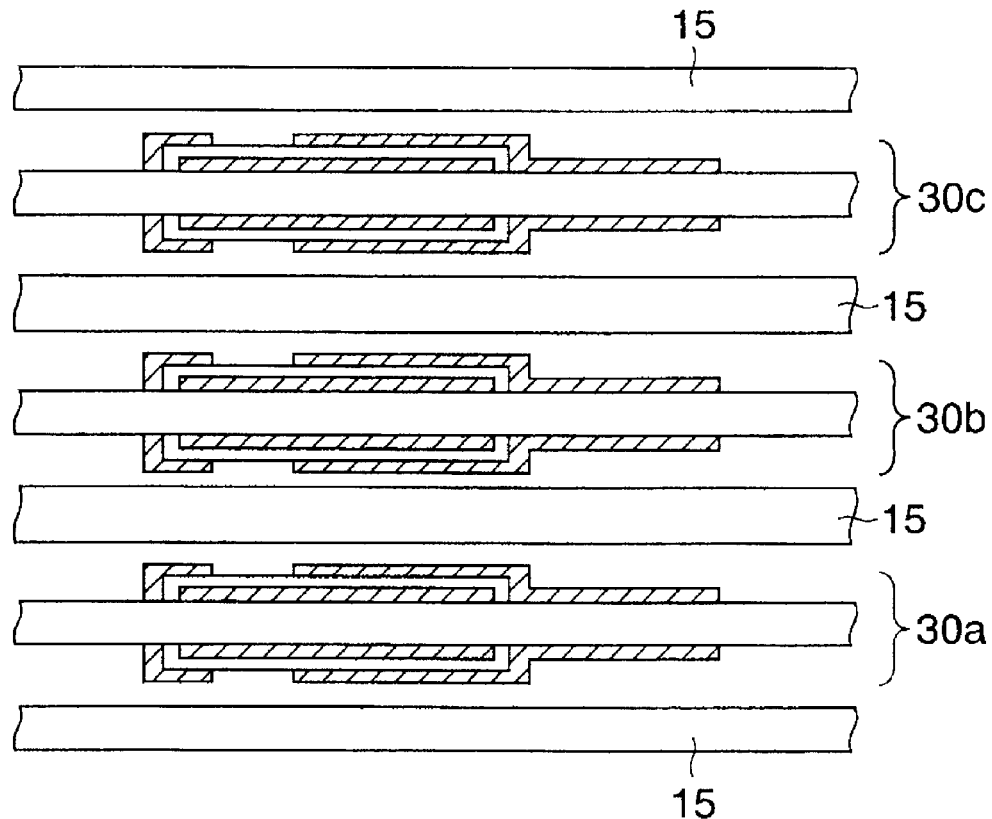
FIG. 2A to FIG. 2P are cross-sectional views showing a manufacturing process of the semiconductor package shown in FIG. 1.

In the next step (FIG. 2D), a predetermined number layers (which are three layers in the illustrated example) of printed wiring boards 30a, 30b and 30c are prepared similarly in accordance with the process performed in the steps from FIG. 2A to FIG. 2C. Then, the respective printed wiring boards 30a, 30b and 30c are mutually aligned and stacked while sandwiching the prepregs 15 alternately.

Figure 2E:
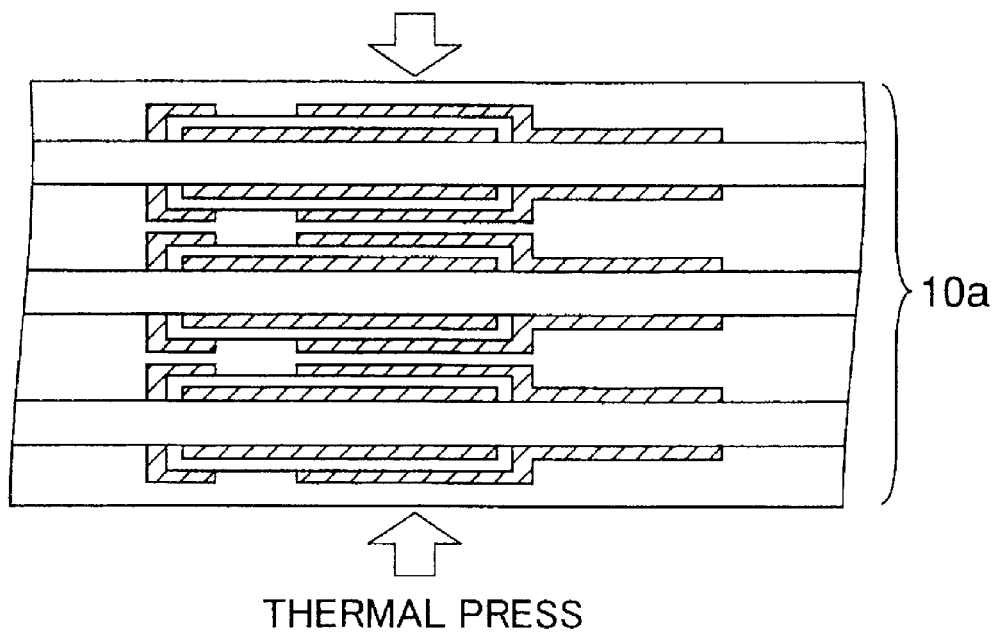

In the next step (FIG. 2E), the respective printed circuit boards 30a, 30b and 30c, which are stacked together while sandwiching the prepregs 15 alternately, are laminated by thermal press in a vacuum ambiance to form the laminated core portion 10a.

In the next step (FIG. 2F), through holes 31 are formed in predetermined positions on the laminated core portion 10a formed in the precedent step, by a drilling process with a mechanical drill or a laser, for example. A YAG laser, a $CO_2$ laser, an excimer laser or the like, is used as the laser therein.

As will be described later, the through holes 31 are provided in order to connect mutually corresponding wiring layers (mutually among the wiring layers 12a, 12b and 12c constituting the first electrode layers of the capacitor portions, and mutually among the wiring layers 14a, 14b and 14c constituting the second electrode layers of the capacitor portions) of the respective printed boards (30a, 30b and 30c in FIG. 2D) electrically via the conductors 16 to be filled inside the through holes 31. Therefore, the positions for forming the through holes 31 are selected from a region where the resin layers 13a are formed on the insulative base member 11a (FIG. 2C) via the wiring layers 12a but not covered with the wiring layers 14a, and from a region where the wiring layers 14a are formed directly on the insulative base member 11a. Furthermore, in the illustrated example, the through hole 31 is also formed in a region where the wiring layers 12a and 14a are not formed on the insulative base member 11a.

In the next step (FIG. 2G), thin-film Cu layers 32 are formed on entire surfaces of the laminated core portion 10a inclusive of inner walls of the through holes 31 by sputtering or electroless plating of Cu.

In the next step (FIG. 2H), the conductors 16 (which is Cu in this case) are filled into the through holes 31. Such filling is performed using an electrolytic plating process or a printing method.

In the case of the electrolytic plating process, for example, Cu is filled inside the through holes 31 by electrolytic plating using the thin-film Cu layers 32 formed in the precedent step as feed layers, whereby the Cu layers 16 are formed on the thin-film Cu layers 32. Meanwhile, in the case of the printing process, Cu paste is applied and filled into the through holes 31 by screen printing.

Upon filling the inside of the through holes 31 in this step, as shown in the drawing, small dimples are formed on surfaces of the Cu layers 16 at portions corresponding to the positions of the through holes 31. In other words, the surfaces of the Cu layers 16 are left uneven.

In the next step (FIG. 2I), uneven portions on surfaces of the Cu layers 16 are polished by mechanical polishing, for example, whereby both surfaces of the laminated core portion 10a are planarized until surfaces of the prepreg layers (the insulating layers) 15 are exposed.

In the next step (FIG. 2J), wiring patterns (the wiring layers 17) of predetermined shapes are formed on the both surfaces of the laminated core portion 10a including the through holes filled with the conductors 16.

To be more precise, thin-film Cu layers are formed on the both surfaces of the laminated core portion 10a by electroless plating of Cu, and then Cu layers are formed on entire surfaces by electrolytic plating of Cu using the thin-film Cu layers as feed layers. Thereafter, the Cu layers are patterned into the predetermined shapes by photolithography to form the wiring layers 17 (inclusive of pads). The wiring layers 17 severally constitute primary wiring layers of the build-up wiring portions 10b disposed on and under the laminated core portion 10a.

In the next step (FIG. 2K), thermosetting polyimide resin or the like is applied to entire surfaces of the insulating layers 15 and the wiring layers 17, and then the resin is hardened by heating so as to form the resin layers (the insulating layers) 18.

Figure 2F:
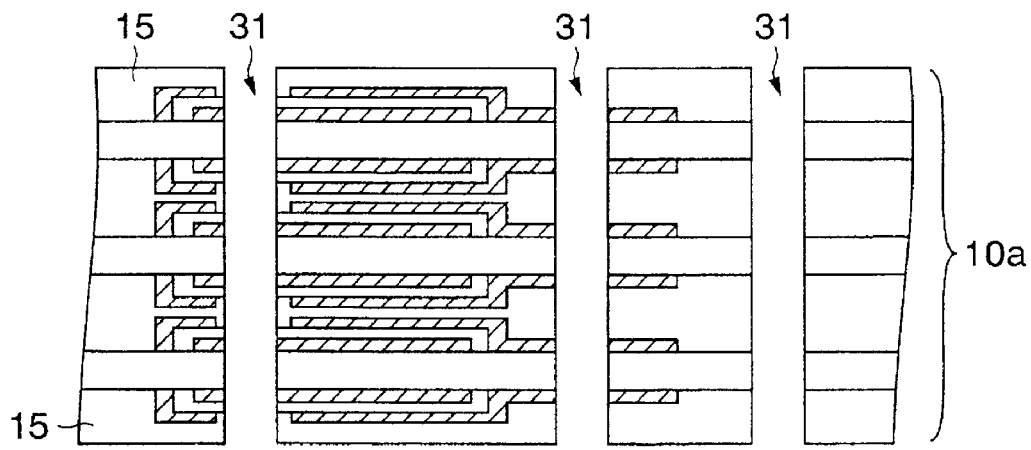
Figure 2G:
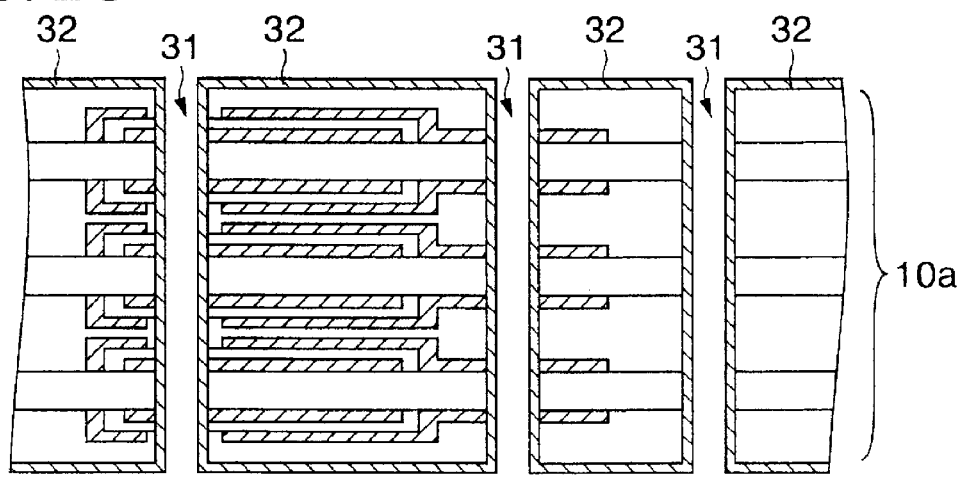
Figure 2H:
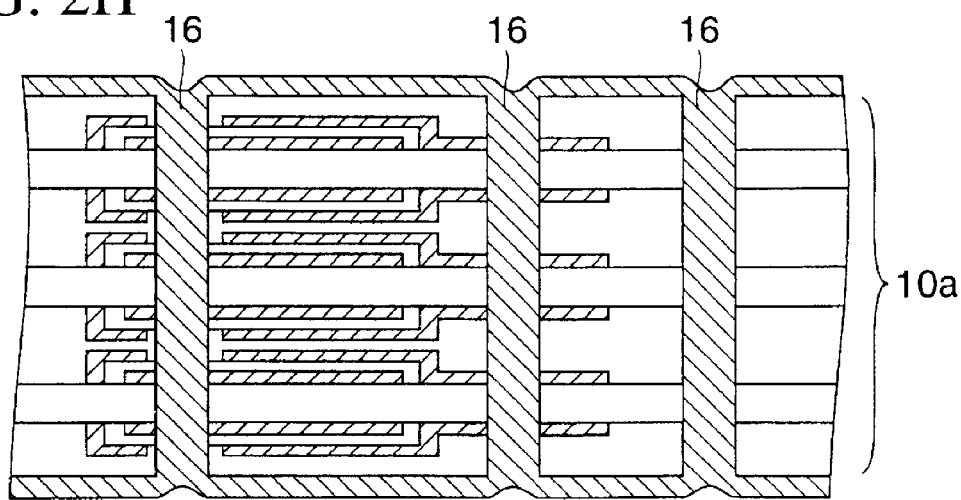
Figure 2I:
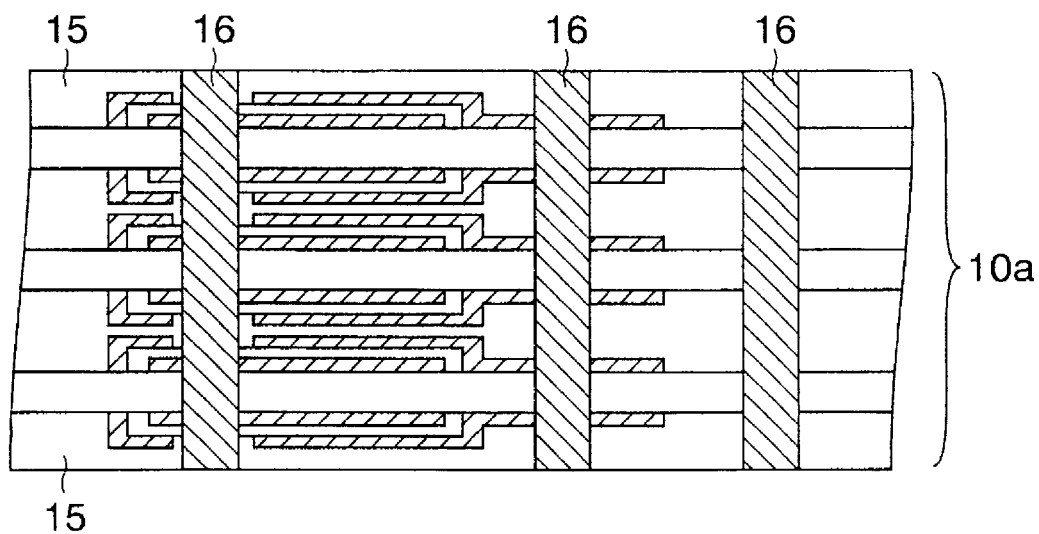

In the next step (FIG. 2L), the via holes 19 of truncated cone shapes are formed on predetermined positions on the resin layers 18 so as to reach the pads (the wiring layers 17) thereunder using the process similar to the drilling process with the laser, which is performed in the step of FIG. 2F.

Figure 2J:
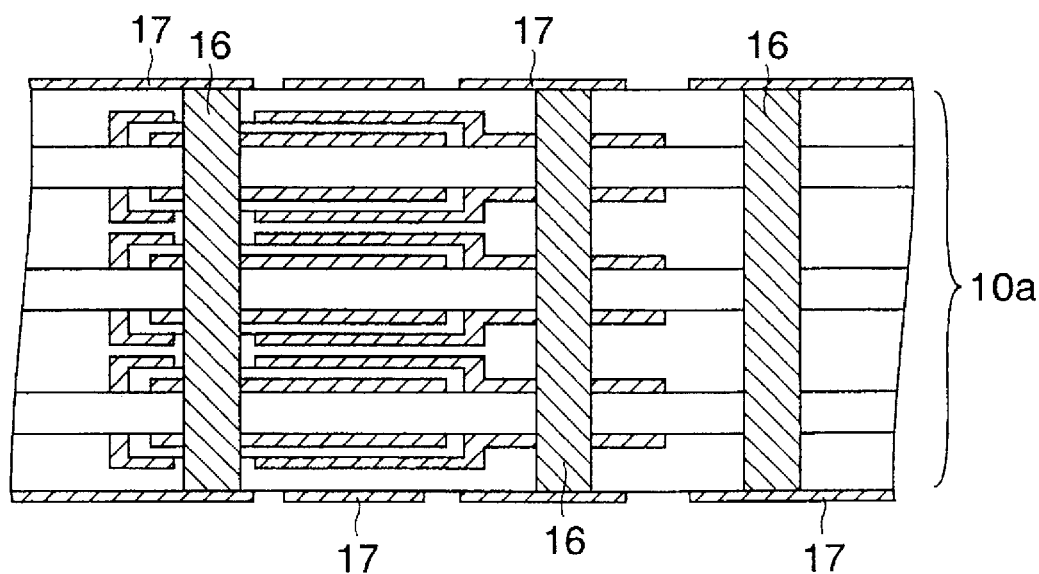
Figure 2K:
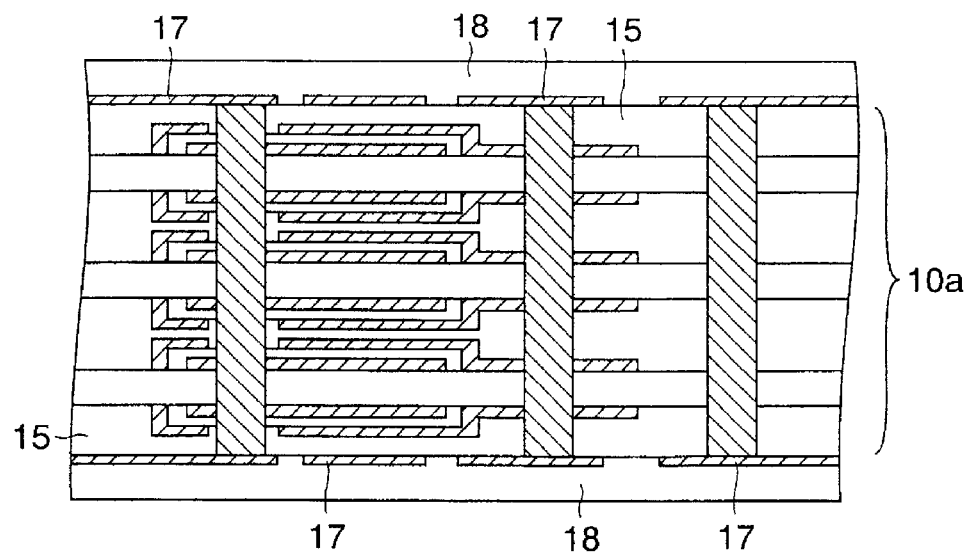
Figure 2L:
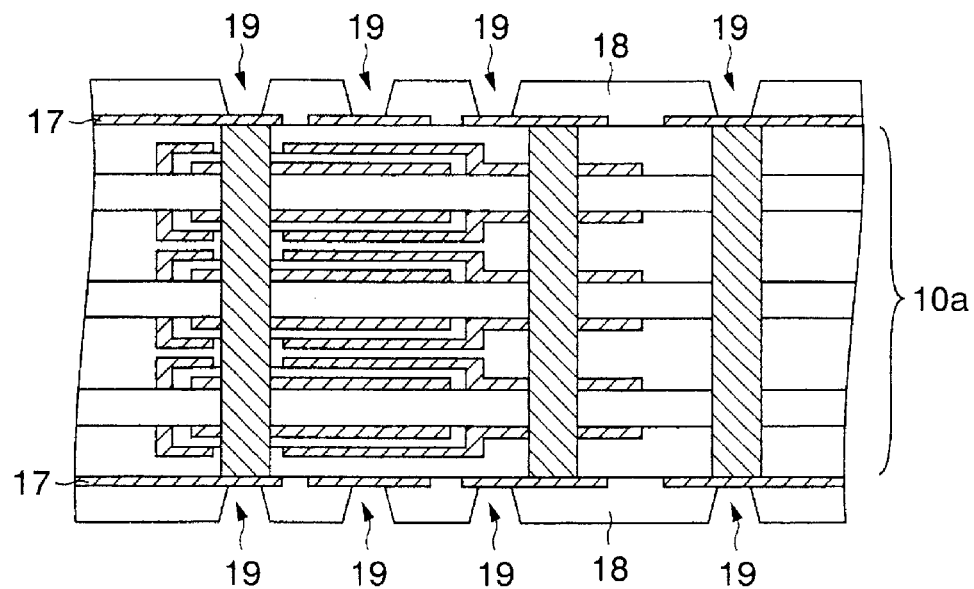
Figure 2M:
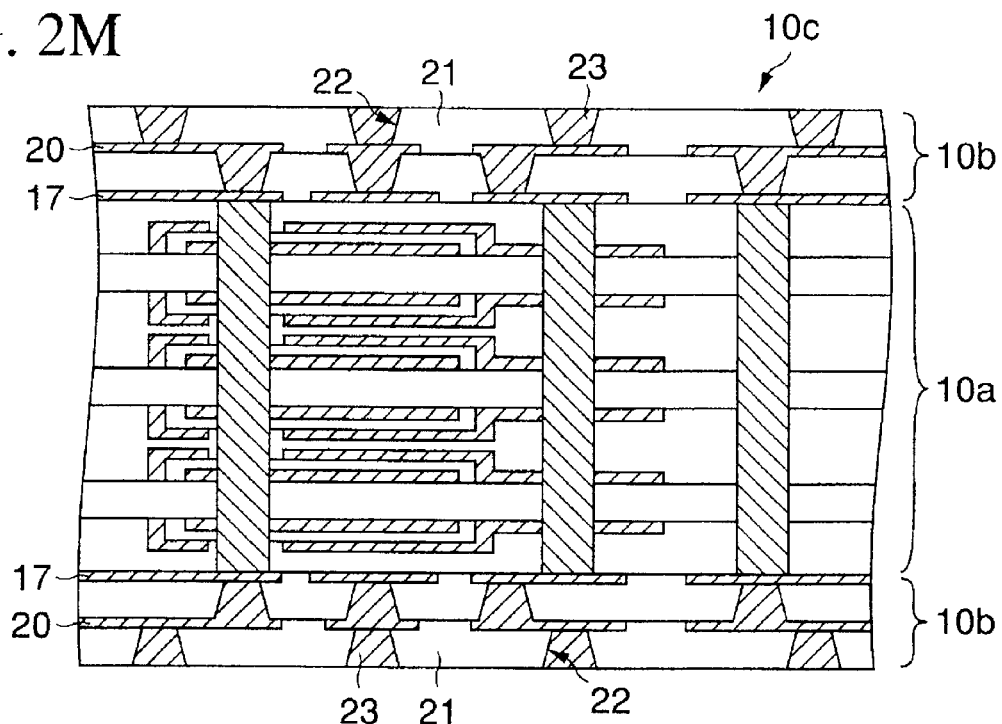

In the next step (FIG. 2M), the wiring layers 20, the resin layers (the insulating layers) 21 and the via holes 22 are sequentially formed as similar to the process performed in the steps from FIG. 2J to FIG. 2L, and then the inside of the via holes 22 are finally filled with the conductors 23 to form a multilayer wiring board 10c.

Specifically, the patterned wiring layers 20 (inclusive of pads) are formed on the resin layers 18 including the inside of the via holes 19. Then, the resin layers 21 are formed on the resin layers 18 and the wiring layers 20, and the via holes 22 of truncated cone shapes are formed in the predetermined positions on the resin layers 21 so as to reach the pads (the wiring layers 20) thereunder. Finally, the inside of the via holes 22 are filled with the conductors 23 (which is Cu in this case). Such filling can be performed using an electrolytic plating process or a printing method.

Here, the wiring layers 20 constitute secondary wiring layers of the build-up wiring portions 10b disposed on and under the laminated core portion 10a. At the same time, the wiring layers 20 are electrically connected to the primary wiring layers 17 via the conductors (Cu) filled in the via holes 19.

Figure 2N:
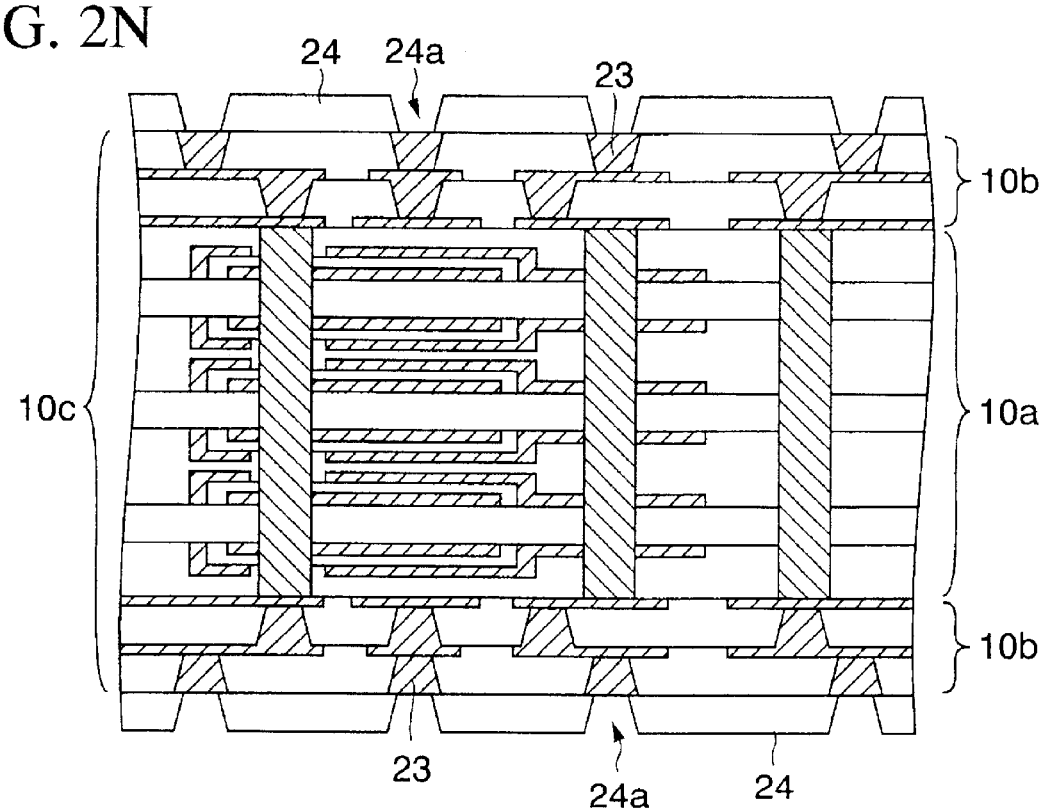

In the next step (FIG. 2N), the solder resist layers 24 as protective layers are formed on both surfaces of the multilayer wiring board 10c, and openings 24a are formed on the respective solder resist layer 24 at portions corresponding to positions of the conductors 23 thereunder.

To be more precise, photosensitive solder resist is applied to the both surfaces of the multilayer wiring board 10c by screen printing, for example (formation of the solder resist layers 24), and then the respective solder resist layers 24 are subjected to exposure and development using masks (not shown) severally patterned into the predetermined shapes (patterning the solder resist layers 24), whereby the portions of the respective solder resist layers 24 corresponding to the positions of the conductors 23 thereunder are made open (formation of the openings 24a). In this way, only the conductors 23 are exposed from the openings 24a and the other portions are covered with the solder resist layers 24.

Figure 2O:
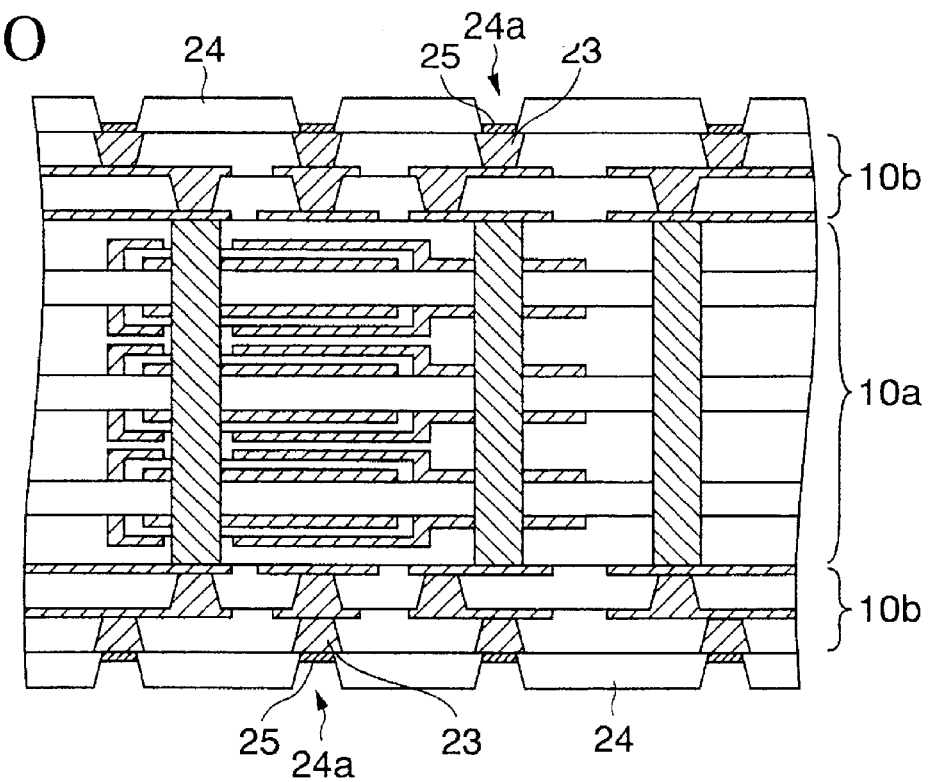
Figure 2P:
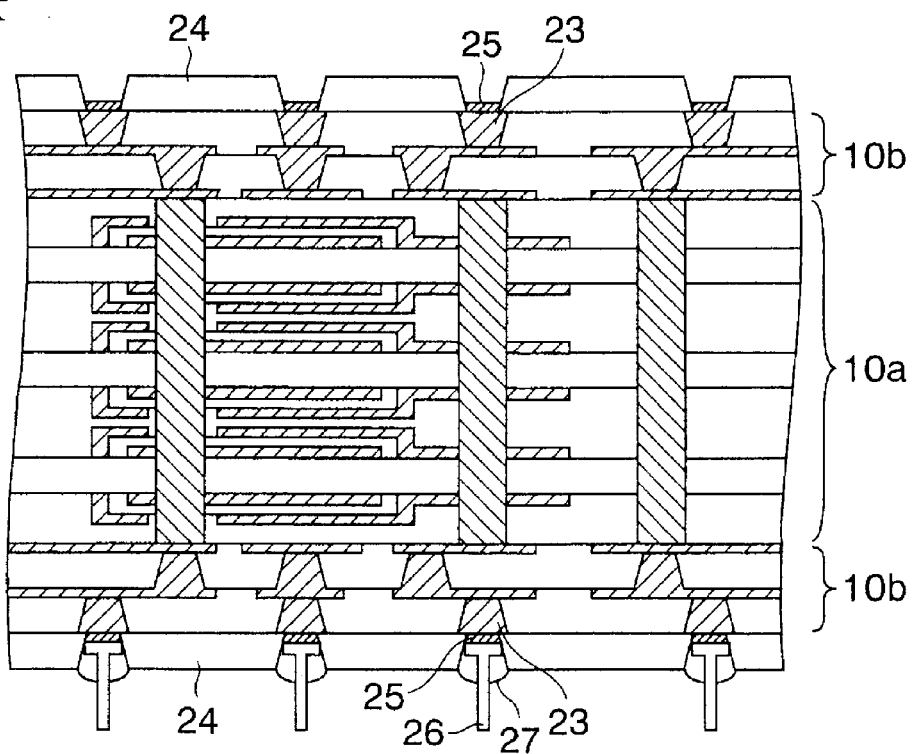

In the next step (FIG. 2O), electrolytic plating of Ni and Au is sequentially provided on the conductors 23 exposed from the openings 24a of the solder resist layers 24 using the conductor 23 as a feeding layer, whereby Ni/Au plated films 25 are formed.

Such formation of the Ni/Au plated films 25 enhances adhesion to the conductors (Cu) 23 and contributes to an enhancement of conductivity upon bonding the pins 26 in the next step and conductivity upon bonding the electrode terminals 2 of the semiconductor chip 1 in the later step.

In the last step (FIG. 2P), the pins 26 as external connection terminals are bonded to the Ni/Au plated films 25 on the respective conductors 23 exposed from the openings of the lower solder resist layer 24.

Specifically, an appropriate amount of paste solder 27 is put on the Ni/Au plated film 25 on each of the conductors 23. Then, the T-shaped pin 26 having a head as large as the opening is disposed thereon in a manner that the head is located downward (located upward in the illustrated example, because the multilayer wiring board 10c is turned over after finishing this step). Thereafter, the solder 27 is hardened by reflow and the pin 26 is fixed accordingly.

According to the foregoing steps, the semiconductor package 10 (FIG. 1) of this embodiment is fabricated.

In the above-described method of manufacturing the semiconductor package 10, the inside of the through holes 31 are filled with the conductors 16 (as shown in FIG. 2H) in order to exemplify containment of the capacitor portions, which is the characteristic of the present invention. However, the through holes provided in the regions other than the region of the capacitor portions do not have to be filled with conductors. Specifically, the insides of the through holes provided in the regions other than the region of the capacitor portions may be filled with insulators (resin such as thermosetting polyimide resin or epoxy resin, for example).

When the semiconductor chip 1 is mounted on the semiconductor package 10 of this embodiment to obtain a semiconductor device, the chip 1 is mounted in a manner that the electrode terminals 2 of the semiconductor chip 1 (such as solder bumps) are connected electrically to the plated films 25 on the respective conductors 23 exposed from the openings on the upper solder resist layer 24 of the package 10. Such mounting can be performed by flip-chip mounting, for example, by ACF mounting using an anisotropic conductive film (ACF).

Moreover, when the package 10 is mounted on a mounting board such as a mother board, an appropriate amount of paste solder is put on conductors (pads) corresponding to the board, and legs of the pins 26 are put thereon. Then, the solder is hardened by reflow so as to electrically connect the both members.

As described above, according to the semiconductor package 10 and the method of manufacturing the same according to this embodiment, the capacitor portions are constituted in such a manner that: the dielectric layers are composed of the resin layers 13a, 13b and 13c, which are formed on the surfaces of the wiring layers 12a, 12b and 12c on the insulative base members 11a, 11b and 11c using the electrophoretic deposition process; the first electrode layers are composed of the pins 26, which are electrically connected to the respective wiring layers 12a, 12b and 12c through the conductors 16, the wiring layers 17 and 20, the conductors 23 and the plated films 25; and the second electrode layers composed of the pins 26, which are electrically connected to the respective wiring layers 14a, 14b and 14c severally formed on the insulative base members 11a, 11b and 11c inclusive of the resin layers 13a, 13b and 13c, through the conductors 16, the wiring layers 17 and 20, the conductors 23 and the plated films 25. Therefore, it is possible to realize a suppression of occurrence of crosstalk noises between a plurality of wiring, or a suppression of variation in electric potential of a power source line.

Moreover, some of the members constituting the semiconductor package 10 (namely, the wiring layers 12a, 12b and 12c, the wiring layers 14a, 14b and 14c, and the resin layers 13a, 13b and 13c) are also used as the respective electrode layers and as the dielectric layers of the capacitor portions. Accordingly, it is unnecessary to build a sheet member into the package for capacitor elements as encountered in the prior art. Such an advantage contributes to a formation of the low-profile semiconductor package 10 as well as to a reduction in manufacturing costs.

Figure 3:
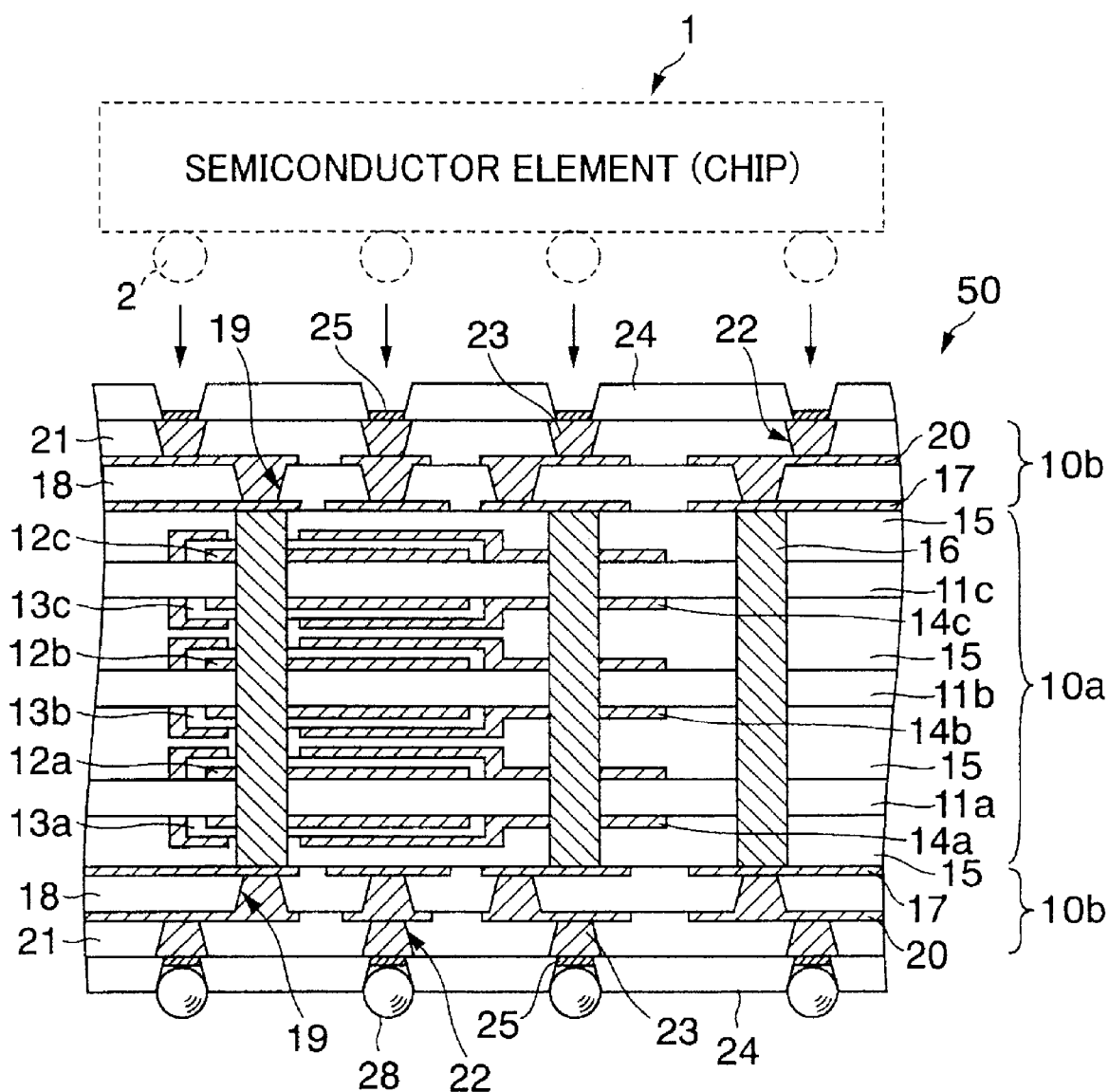
FIG. 3 is a cross-sectional view showing a constitution of a semiconductor package according to another embodiment of the present invention.

In the foregoing embodiment, description has been made regarding the case where the pins 26 are applied as the external connection terminals for mounting the semiconductor package 10 on a mother board or the like. However, it is needless to say that the shape of the external connection terminals is not limited to the pins. For example, it is also possible to adopt a ball shape as seen in BGA or the like. FIG. 3 shows such an example.

FIG. 3 schematically shows a cross-sectional constitution of a semiconductor package 50, which applies solder balls 28 as the external connection terminals. Since other parts of the constitution are similar to the embodiment shown in FIG. 1, description thereof will be omitted.

Moreover, in the semiconductor packages 10 and 50 according to the foregoing embodiments, description has been made regarding the multilayer wiring structure composed of the laminated core portion 10 formed by laminating the printed wiring boards severally provided with the capacitor portions, and the build-up wiring portions 10b formed on the both surfaces thereof using the buildup method. However, it is needless to say that the form of the package is not limited thereto. As it is obvious from the gist of the present invention (to form a resin layer on a wiring layer formed on an insulative base member using an electrophoretic deposition process, and to use the resin layer as a dielectric layer of a capacitor portion), the present invention is widely applicable regardless of whether the form of the package is based on lamination of a plurality of printed wiring boards by thermal press, or whether the package adopts a multilayer wiring structure using a build-up method.

What is claimed is:

1. A semiconductor package manufactured by a method of manufacturing a semiconductor package containing a capacitor portion, the method comprising the steps of:

forming a first wiring layer on an insulative base member, the first wiring layer being patterned in a predetermined shape for serving as a first electrode layer of the capacitor portion;

forming a resin layer on a surface of the first wiring layer for serving as a dielectric layer of the capacitor layer by an electrophoretic deposition process;

forming a second wiring layer on the insulative base member inclusive of the resin layer, the second wiring layer being patterned in a predetermined shape for serving as a second electrode layer of the capacitor portion;

forming a laminated core portion by preparing a predetermined number of printed wiring boards each of which is a structure made by forming the first wiring layer, the resin layer and the second wiring layer sequentially on the insulative base member, and by laminating the respective printed wiring boards by thermal press in a vacuum ambiance while interposing prepregs severally between the printed wiring boards;

forming through holes on the laminated core portion severally in a region where the resin layer is formed via the first wiring layer on the insulative base member but uncovered with the second wiring layer, and in a region where the second wiring layer is formed directly on the insulative base member;

filling insides of the through holes with conductors;

forming third wiring layers patterned into predetermined shapes on both surfaces of the laminated core portion inclusive of the through holes filled with the conductors;

forming insulating layers on both surfaces of the laminated core portion inclusive of the third wiring layers;

forming via holes in predetermined positions of the insulating layer so as to reach respective pads of the third wiring layer;

forming a multilayer wiring board by sequentially repeating formation of a patterned wiring layer, an insulating layer and via holes so as to constitute a required number of layers, and finally by filling insides of the via holes with conductors;

forming protective films on both surfaces of the multilayer wiring board and then forming openings in the respective protective films at portions corresponding to positions of the conductors inside the via holes; and bonding external connection terminals to the conductors exposed from the openings formed in one of the protective films.

2. A semiconductor device comprising:

the semiconductor package according to claim 1; and a semiconductor element mounted on an opposite side of the semiconductor package to the side where the external connection terminals are bonded, electrode terminals of the semiconductor element being electrically connected to the conductors exposed from the openings formed in the protective film.

3. A semiconductor package manufactured by a method of manufacturing a semiconductor package containing a capacitor portion, the method comprising the steps of:

forming a first wiring layer on an insulative base member, the first wiring layer being patterned in a predetermined shape for serving as a first electrode layer of the capacitor portion;

forming a resin layer on a surface of the first wiring layer for serving as a dielectric layer of the capacitor layer by an electrophoretic deposition process;

forming a second wiring layer on the insulative base member inclusive of the resin layer, the second wiring layer being patterned in a predetermined shape for serving as a second electrode layer of the capacitor portion;

forming a laminated core portion by preparing a predetermined number of printed wiring boards each of which is a structure made by forming the first wiring layer, the resin layer and the second wiring layer sequentially on the insulative base member, and by laminating the respective printed wiring boards by thermal press in a vacuum ambiance while interposing prepregs severally between the printed wiring boards;

forming through holes on the laminated core portion severally in a region where the resin layer is formed via the first wiring layer on the insulative base member but uncovered with the second wiring layer, and in a region where the second wiring layer is formed directly on the insulative base member;

filling insides of the through holes with conductors;

forming third wiring layers patterned into predetermined shapes on both surfaces of the laminated core portion inclusive of the through holes filled with the conductors;

forming insulating layers on both surfaces of the laminated core portion inclusive of the third wiring layers;

forming via holes in predetermined positions of the insulating layer so as to reach respective pads of the third wiring layer;

forming a multilayer wiring board by sequentially repeating formation of a patterned wiring layer, an insulating layer and via holes so as to constitute a required number of layers, and finally by filling insides of the via holes with conductors;

forming protective films on both surfaces of the multilayer wiring board and then forming openings in the respective protective films at portions corresponding to positions of the conductors inside the via holes;

forming plated films on the conductors exposed from the openings of the respective protective films; and bonding external connection terminals to the conductors exposed from the openings formed in one of the protective films.

4. A semiconductor device comprising:

the semiconductor package according to claim 3; and a semiconductor element mounted on an opposite side of the semiconductor package to the side where the external connection terminals are bonded, electrode terminals of the semiconductor element being electrically connected to the conductors exposed from the openings formed in the protective film.

* * * * *